(12) United States Patent
Koudymov et al.

(10) Patent No.: US 8,940,620 B2
(45) Date of Patent: Jan. 27, 2015

(54) COMPOSITE WAFER FOR FABRICATION OF SEMICONDUCTOR DEVICES

(75) Inventors: Alexei Koudymov, Troy, NY (US); Jamal Ramdani, Raritan, NJ (US); Kierthi Swaminathan, Highland Park, NJ (US)

(73) Assignee: Power Integrations, Inc., San Jose, CA (US)

( * ) Notice: Subject to any disclaimer, the term of this patent is extended or adjusted under 35 U.S.C. 154(b) by 0 days.

(21) Appl. No.: 13/374,206

(22) Filed: Dec. 15, 2011

(65) Prior Publication Data

US 2013/0157440 A1    Jun. 20, 2013

(51) Int. Cl.
    *H01L 21/00* (2006.01)
(52) U.S. Cl.
    USPC ................................. 438/464; 257/E21.701
(58) Field of Classification Search
    USPC .......................................... 438/464, 452, 458
    See application file for complete search history.

(56) References Cited

U.S. PATENT DOCUMENTS

| | | | |
|---|---|---|---|
| 3,775,200 A | 11/1973 | De Nobel et al. |
| 4,142,195 A | 2/1979 | Carlson et al. |
| 4,233,617 A | 11/1980 | Klaassen et al. |
| 4,408,216 A | 10/1983 | Gould |
| 4,543,595 A | 9/1985 | Vora |
| 4,745,445 A | 5/1988 | Mun et al. |
| 4,946,547 A | 8/1990 | Palmour et al. |
| 4,967,243 A | 10/1990 | Baliga et al. |
| 5,200,022 A | 4/1993 | Kong et al. |
| 5,602,418 A | 2/1997 | Imai et al. |
| 5,612,567 A | 3/1997 | Baliga |
| 5,686,738 A | 11/1997 | Moustakas |
| 5,689,128 A | 11/1997 | Hshieh et al. |
| 5,741,724 A | 4/1998 | Ramdani et al. |
| 5,785,606 A | 7/1998 | Marquez |
| 5,874,747 A | 2/1999 | Redwing et al. |
| 5,877,558 A | 3/1999 | Nakamura et al. |
| 6,051,340 A | 4/2000 | Kawakami et al. |
| 6,078,090 A | 6/2000 | Williams et al. |
| 6,121,121 A | 9/2000 | Koide |
| 6,139,628 A | 10/2000 | Yuri et al. |
| 6,146,457 A | 11/2000 | Solomon |

(Continued)

FOREIGN PATENT DOCUMENTS

| | | |
|---|---|---|
| CN | 101689561 | 3/2010 |
| EP | 0081414 | 6/1983 |

(Continued)

OTHER PUBLICATIONS

Arulkumaran et al. "Studies on the Influences of I-GaN, N-GaN, P-GaN and InGaN Cap Layers in AlGaN/GaN High-Electron-Mobility Transistors," Japanese Journal of Applied Physics, Japan Society of Applied Physics, JP, vol. 44, No. 5A, May 10, 2005, pp. 2953-2960, XP001502490, ISSN: 0021-4922.

(Continued)

*Primary Examiner* — Reema Patel
(74) *Attorney, Agent, or Firm* — The Law Offices of Bradley J. Bereznak

(57) ABSTRACT

A composite wafer includes a first substrate having a first vertical thickness and a top surface, the top surface being prepared in a state for subsequent semiconductor material epitaxial deposition. A carrier substrate is disposed beneath the first substrate. The carrier substrate has a second vertical thickness greater than the first vertical thickness. An interlayer bonds the first substrate to the carrier substrate.

14 Claims, 3 Drawing Sheets

(56) References Cited

U.S. PATENT DOCUMENTS

| | | | |
|---|---|---|---|
| 6,184,570 B1 | 2/2001 | MacDonald, Jr. et al. | |
| 6,211,018 B1 | 4/2001 | Nam et al. | |
| 6,239,033 B1 | 5/2001 | Kawai | |
| 6,329,677 B1 | 12/2001 | Oguri et al. | |
| 6,331,450 B1 | 12/2001 | Uemura | |
| 6,344,665 B1 | 2/2002 | Sung et al. | |
| 6,380,108 B1 | 4/2002 | Linthicum et al. | |
| 6,389,051 B1 | 5/2002 | Van de Walle | |
| 6,432,579 B1 | 8/2002 | Tsuji et al. | |
| 6,437,374 B1 | 8/2002 | Northrup et al. | |
| 6,492,669 B2 | 12/2002 | Nakayama et al. | |
| 6,507,041 B2 | 1/2003 | Nakamura et al. | |
| 6,515,308 B1 * | 2/2003 | Kneissl et al. | 257/86 |
| 6,518,079 B2 * | 2/2003 | Imler | 438/33 |
| 6,524,900 B2 | 2/2003 | Dahlqvist et al. | |
| 6,573,537 B1 | 6/2003 | Steigerwald et al. | |
| 6,586,777 B1 | 7/2003 | Yuasa et al. | |
| 6,586,781 B2 | 7/2003 | Wu et al. | |
| 6,593,597 B2 | 7/2003 | Sheu | |
| 6,605,854 B2 | 8/2003 | Nagase et al. | |
| 6,608,327 B1 | 8/2003 | Davis et al. | |
| 6,610,995 B2 | 8/2003 | Nakamura et al. | |
| 6,624,444 B1 | 9/2003 | Li | |
| 6,627,967 B2 | 9/2003 | Asano et al. | |
| 6,649,995 B2 | 11/2003 | Tooi et al. | |
| 6,656,823 B2 | 12/2003 | Lee et al. | |
| 6,685,804 B1 | 2/2004 | Ikeda et al. | |
| 6,768,146 B2 | 7/2004 | Yoshida | |
| 6,809,375 B2 | 10/2004 | Takemori et al. | |
| 6,855,970 B2 | 2/2005 | Hatakeyama et al. | |
| 6,949,401 B2 | 9/2005 | Kaminski et al. | |
| 6,949,774 B2 | 9/2005 | Parikh et al. | |
| 7,026,665 B1 | 4/2006 | Smart et al. | |
| 7,033,854 B2 * | 4/2006 | Morita | 438/40 |
| 7,041,579 B2 * | 5/2006 | Barsky et al. | 438/464 |
| 7,084,456 B2 | 8/2006 | Williams et al. | |
| 7,084,475 B2 | 8/2006 | Shelton et al. | |
| 7,109,551 B2 | 9/2006 | Sugi et al. | |
| 7,115,896 B2 | 10/2006 | Gao et al. | |
| 7,116,567 B2 | 10/2006 | Shelton et al. | |
| 7,118,970 B2 | 10/2006 | Das et al. | |
| 7,220,661 B1 | 5/2007 | Yu et al. | |
| 7,229,866 B2 | 6/2007 | Zhu et al. | |
| 7,235,330 B1 | 6/2007 | Fujimoto et al. | |
| 7,238,976 B1 | 7/2007 | Yu et al. | |
| 7,253,015 B2 | 8/2007 | Pophristic et al. | |
| 7,323,402 B2 | 1/2008 | Chiola | |
| 7,329,587 B2 * | 2/2008 | Bruederl et al. | 438/458 |
| 7,417,266 B1 | 8/2008 | Li et al. | |
| 7,476,956 B2 | 1/2009 | Parikh et al. | |
| 7,547,928 B2 | 6/2009 | Germain et al. | |
| 7,638,818 B2 | 12/2009 | Wu et al. | |
| 7,696,540 B2 | 4/2010 | Francis et al. | |
| 7,696,598 B2 | 4/2010 | Francis et al. | |
| 7,863,172 B2 | 1/2011 | Zhu et al. | |
| 7,939,853 B2 | 5/2011 | Murphy et al. | |
| 8,026,568 B2 | 9/2011 | Zhu et al. | |
| 8,097,512 B2 | 1/2012 | Li et al. | |
| 8,169,003 B2 | 5/2012 | Murphy et al. | |
| 8,399,911 B2 | 3/2013 | Derluyn et al. | |
| 8,592,866 B2 | 11/2013 | Yanagihara et al. | |
| 2001/0001494 A1 | 5/2001 | Kocon | |
| 2002/0015833 A1 | 2/2002 | Takahashi et al. | |
| 2003/0015708 A1 | 1/2003 | Parikh et al. | |
| 2003/0020135 A1 | 1/2003 | Kaminski et al. | |
| 2003/0062525 A1 | 4/2003 | Parikh et al. | |
| 2003/0098462 A1 | 5/2003 | Yoshida | |
| 2004/0016965 A1 | 1/2004 | Ui et al. | |
| 2004/0021152 A1 | 2/2004 | Nguyen et al. | |
| 2004/0119063 A1 | 6/2004 | Guo et al. | |
| 2005/0087763 A1 | 4/2005 | Kanda et al. | |
| 2005/0127754 A1 | 6/2005 | Muth | |
| 2005/0151255 A1 | 7/2005 | Ando et al. | |
| 2005/0179104 A1 | 8/2005 | Shelton et al. | |
| 2005/0179106 A1 | 8/2005 | Asano et al. | |
| 2005/0179107 A1 | 8/2005 | Pophristic et al. | |
| 2005/0194610 A1 | 9/2005 | Souma et al. | |
| 2005/0202661 A1 | 9/2005 | Ceruzzi et al. | |
| 2005/0215012 A1 | 9/2005 | Williams et al. | |
| 2005/0242365 A1 * | 11/2005 | Yoo | 257/103 |
| 2006/0108606 A1 | 5/2006 | Saxler et al. | |
| 2006/0145283 A1 | 7/2006 | Zhu et al. | |
| 2006/0151868 A1 | 7/2006 | Zhu et al. | |
| 2006/0186422 A1 | 8/2006 | Gaska et al. | |
| 2006/0197107 A1 | 9/2006 | Kanamura et al. | |
| 2006/0244010 A1 | 11/2006 | Saxler | |
| 2006/0261356 A1 | 11/2006 | Iwakami et al. | |
| 2006/0261384 A1 | 11/2006 | Rueb et al. | |
| 2007/0114569 A1 | 5/2007 | Wu et al. | |
| 2007/0228415 A1 | 10/2007 | Kanamura et al. | |
| 2009/0191674 A1 | 7/2009 | Germain et al. | |
| 2009/0278233 A1 | 11/2009 | Pinnington et al. | |
| 2010/0012977 A1 | 1/2010 | Derluyn et al. | |
| 2010/0025730 A1 | 2/2010 | Heikman et al. | |
| 2010/0176421 A1 | 7/2010 | Van Hove et al. | |
| 2010/0330754 A1 | 12/2010 | Hebert | |
| 2011/0101370 A1 | 5/2011 | Cheng et al. | |
| 2011/0156212 A1 | 6/2011 | Arena | |
| 2011/0272742 A1 | 11/2011 | Akiyama et al. | |
| 2012/0112263 A1 | 5/2012 | Tanaka et al. | |
| 2012/0153301 A1 | 6/2012 | Shealy et al. | |
| 2012/0156836 A1 | 6/2012 | Shealy et al. | |
| 2012/0156895 A1 | 6/2012 | Shealy et al. | |
| 2012/0319169 A1 | 12/2012 | Van Hove | |

FOREIGN PATENT DOCUMENTS

| | | |
|---|---|---|
| EP | 0514018 | 11/1992 |
| EP | 1612866 | 1/2006 |
| EP | 1643561 | 4/2006 |
| FR | 2844099 | 3/2004 |
| FR | 2857982 | 1/2005 |
| JP | 11040847 | 2/1992 |
| JP | 08050922 | 2/1996 |
| JP | 09306504 | 11/1997 |
| JP | 11135115 | 5/1999 |
| JP | 11145514 | 5/1999 |
| JP | 2000216409 | 8/2000 |
| JP | 2000512075 | 9/2000 |
| JP | 2001357855 | 12/2001 |
| JP | 2002064201 | 2/2002 |
| JP | 2002083594 | 3/2002 |
| JP | 2003506903 | 2/2003 |
| JP | 2003243323 | 8/2003 |
| JP | 2004087587 | 3/2004 |
| JP | 2004186558 | 7/2004 |
| JP | 2005209377 | 8/2005 |
| JP | 2005317843 | 11/2005 |
| JP | 2006155959 | 6/2006 |
| WO | 9641906 | 12/1996 |
| WO | 0131722 | 5/2001 |
| WO | 0143174 | 6/2001 |
| WO | 03032397 | 4/2003 |

OTHER PUBLICATIONS

Yoshida et al. "A New GaN Based Field Effect Schottky Barrier Diode with a Very Low On-Voltage Operation," Proceedings of 2004 Power Semiconductor Devices & ICs, Kitakyushu, May 24, 2004, pp. 323-326, XP010723404, ISBN: 978-4-88686-060-6.

Hashizume Tamotsu et al. "Chemisty and Electrical Properties of Surfaces of GaN and GaN/AlGaN Heterostructures," Journal of Vacuum Science and Technology: Part B, AVS/AIP, Melville, New York, NY, US, vol. 19, No. 4, Jul. 1, 2001, pp. 1675-1681, XP012008931.

* cited by examiner

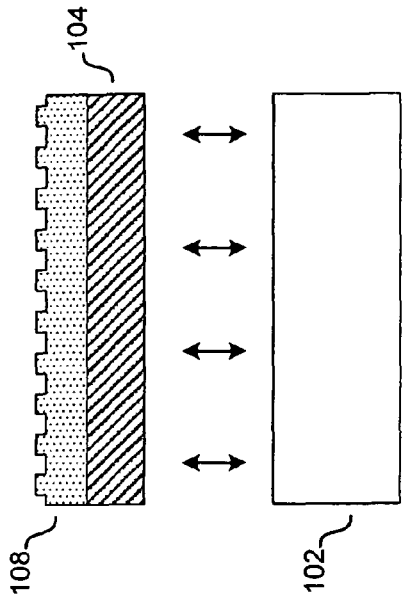
FIG. 1B
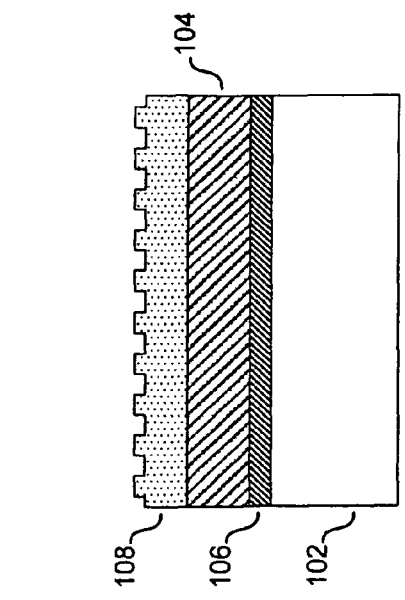
FIG. 1D
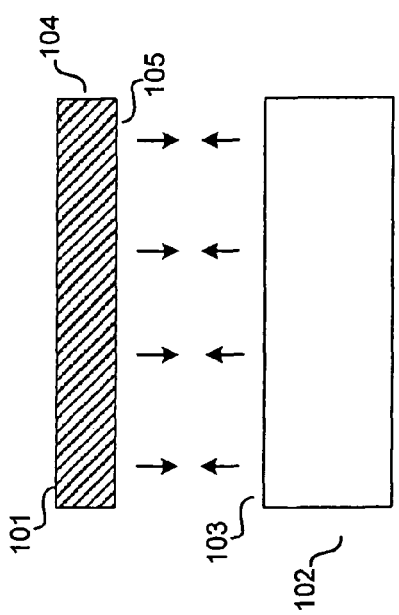
FIG. 1A
FIG. 1C

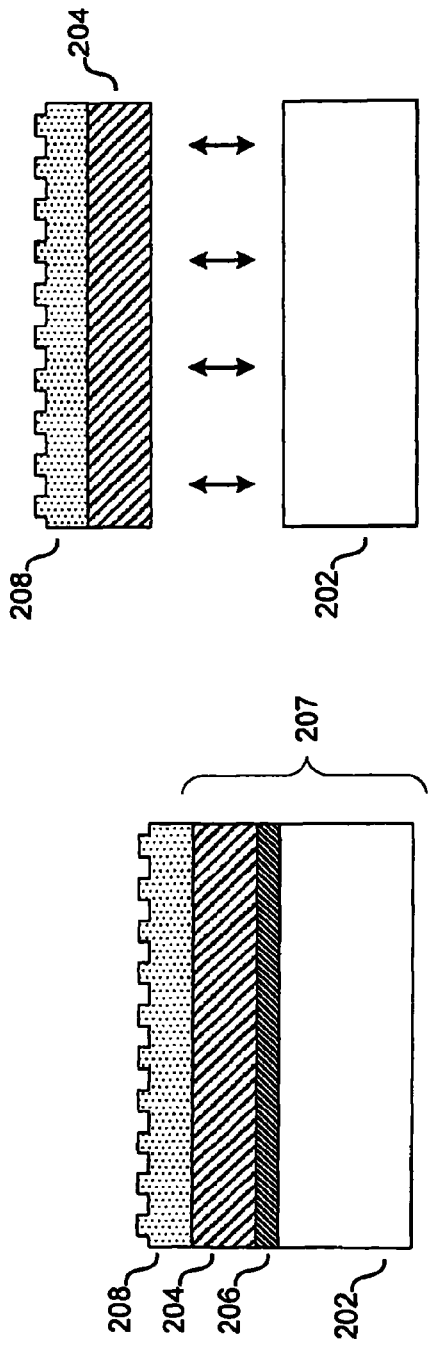
FIG. 2A
FIG. 2B
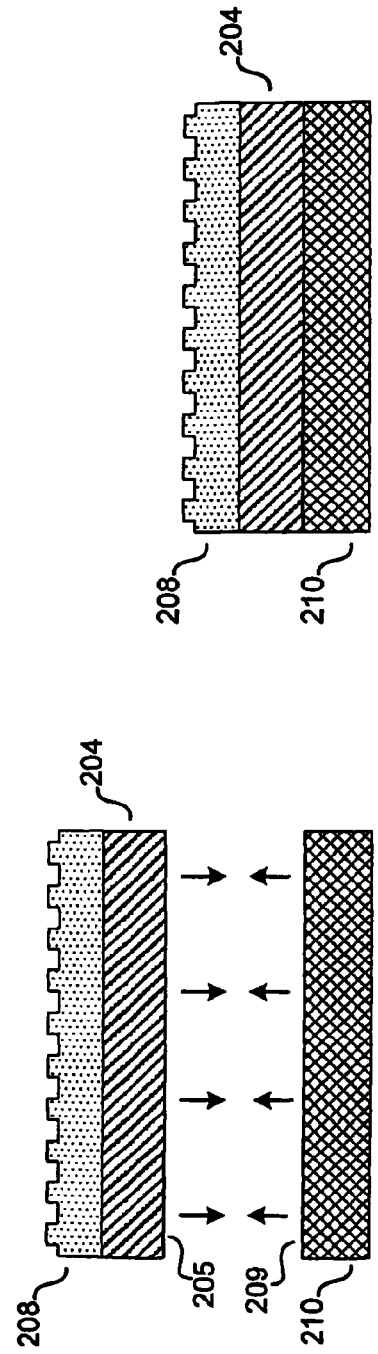
FIG. 2C
FIG. 2D

US 8,940,620 B2

COMPOSITE WAFER FOR FABRICATION OF SEMICONDUCTOR DEVICES

TECHNICAL FIELD

The present invention relates generally to semiconductor device structures and processes for fabricating semiconductor devices on a substrate; more specifically, to apparatus and methods of utilizing a composite wafer to manufacture compound semiconductor devices.

BACKGROUND

Front-end-of-line (FEOL) processing refers to the formation of electronic devices (such as transistors) directly in the semiconductor material, e.g., silicon or nitride-based compound semiconductor materials. The semiconductor material is usually formed on a thin disc called a wafer. Back-end-of-line (BEOL) processing refers to the second part of the manufacturing process wherein the individual devices are interconnected with metal (e.g., patterned lines or traces) on the surface of the wafer. After BEOL processing, post-fabrication processing (also commonly referred to as backend processing) is performed. The backend process steps typically include wafer test, wafer backgrinding (also called backlapping or wafer thinning), die separation, die testing, packaging and final device testing.

Most often, semiconductor wafers are manufactured with a thickness that ensures mechanical stability during FEOL and BEOL processing. Depending on the material type, for example, a 4-inch diameter wafer having a thickness of between roughly 650-750 μm usually provides sufficient stability to avoid cracking and warping during high-temperature processing steps. Wafer backgrinding is the backend process step during which wafer thickness is reduced to make die separation easier and also to allow for high density packaging of integrated circuits (ICs). Die separation is where the individual die or microchips are singulated. The separation process typically involves mechanically cutting or scribing the wafer (e.g., using a laser), then breaking the wafer along the scribe lines to separate the individual die.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIGS. 1A-1D are cross-sectional side views that illustrate an example wafer structure at various stages in a fabrication process, in accordance with embodiments of the present invention.

FIGS. 2A-2D are cross-sectional side views which illustrate another example wafer structure at various stages in a fabrication process, in accordance with embodiments of the present invention.

Figure 4A:
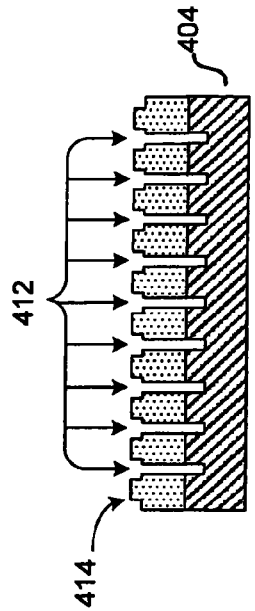
FIGS. 4A & 4B are cross-sectional side views which illustrate an example wafer structure at various stages of another die separation process, in accordance with embodiments of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or sub-combinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

As used herein, a wafer is a slice of bulk material, such as a silicon or sapphire crystal, used in the fabrication of discrete semiconductor components, integrated circuits (ICs), and other microelectronic devices. Wafers are typically formed in circular slices, commonly obtained by parallel cuts of a bulk boule, of a certain diameter, e.g., 6, 9, 12 inches, etc. Wafers may be crystalline or non-crystalline. A crystalline wafer has a specific crystallographic orientation. The wafer serves as the substrate, or foundation, upon which microelectronic devices such as transistors, diodes, and ICs are formed as the result of many fabrication process steps such as epitaxial material growth, doping, ion implantation, etching, deposition of various materials, and photolithographic patterning. The microelectronic devices (e.g., ICs) are commonly replicated in the form of individual die arranged across the wafer.

In the context of the present disclosure, a substrate may either be a semiconductor, an electrical insulator material, or a metal. The type of substrate utilized in a fabrication process typically depends on application requirements such as mechanical strength, conductivity or electrical isolation properties, radio frequency signal absorption and/or transparency in optoelectronic applications, as well as thermal conductivity, and cost. In one embodiment, a carrier substrate refers to a wafer that is bonded to another substrate or wafer.

Sapphire is one of the most commonly used substrate materials for the epitaxial growth of nitride materials such as boron nitride, aluminum nitride, gallium nitride, indium nitride, and their ternary, quaternary, etc., alloys. For nitride-based devices, the FEOL and BEOL processing steps typically require a sapphire substrate thickness in the range of 300-650 μm thick. On the other hand, for reliable die separation the thickness of the sapphire substrate needs to be reduced significantly, e.g., to about 150 μm. This process is generally referred to as substrate thinning. However, sapphire is a very hard material (9.0 on the Mohs scale of hardness). The hardness of sapphire makes mechanical treatments such as cutting, scribing, polishing, backlapping and/or grinding difficult. If the wafer breaks during substrate thinning, this may equate to the loss of the entire wafer and may result in higher yield loss and overall increase in backend cost. Substrate thinning and die separation is therefore a major challenge in the backend processing of nitride material-based devices and ICs.

In accordance with embodiments of the present invention, a composite substrate is utilized for the fabrication of semiconductor devices. In one example, the composite substrate comprises a carrier substrate which is wafer bonded to a relatively thin substrate. During device fabrication, the combined thickness of the carrier substrate and the thin substrate is enough for safe handling such that the composite wafer can withstand the FEOL and BEOL processing steps without breakage. In other words, the carrier substrate provides mechanical support to the thin substrate during the fabrication process. In one embodiment the carrier substrate is removed from the thin substrate after the FEOL and BEOL processing steps, but prior to die separation. In another embodiment, the carrier substrate may be removed from the thin substrate after die separation. As such, embodiments of the present invention may reduce yield loss and overall backend cost since the conventional process of substrate thinning is eliminated.

FIGS. 1A-1D illustrate cross-sectional side views of an example semiconductor wafer structure at various stages of the fabrication process, including a carrier substrate 102, a thin substrate 104, an interlayer 106, and integrated devices 108. The integrated devices 108 may include microelectronic devices such as transistors, diodes, integrated circuits (ICs), etc., which are formed as the result of many fabrication process steps such as doping, ion implantation, etching, deposition of various materials, and photolithographic patterning.

For example, FIG. 1A shows a thin substrate 104 (crystalline or polycrystalline) being attached (i.e., wafer bonded) onto a carrier substrate 102. Thin substrate 104 is shown having a bottom surface 105 and a top surface 101. For one embodiment, the thin substrate 104 comprises a wafer of sapphire material having a thickness in an approximate range of about 50 to 250 μm thick. In other embodiments, thin substrate 104 comprises nitride-based semiconductor materials such as boron nitride, aluminum nitride, gallium nitride, indium nitride and their ternary, quaternary and other alloys. In further embodiments, thin substrate 104 may comprise materials such as diamond, silicon carbide, or zinc oxide. The bottom surface 105 of thin substrate 104 is shown being bonded onto an upper surface 103 of carrier substrate 102. The carrier substrate 102 provides a strong and stable mechanical support structure for thin substrate 104 during the FEOL and BEOL processing steps.

In various embodiments, carrier substrate 102 comprises a wafer of crystalline or polycrystalline material. In the embodiment shown, carrier substrate 102 has a thickness substantially greater than the thickness of thin substrate 104. Example materials which may be utilized for carrier substrate 102 include sapphire, silicon, copper, nitride-based materials, diamond, silicon carbide, zinc oxide, graphite or other suitable materials that provide mechanical stability during the fabrication process. The material utilized for carrier substrate 102 may be selected based on a number of different considerations such as cost, easy of handling, availability, hardness (mechanical strength), thermal-mechanical compatibility with thin substrate 104 (namely, thermal expansion coefficient matching), and ability to withstand die separation techniques.

In one embodiment, the material used for carrier substrate 102 has a coefficient of thermal expansion that is substantially matched to that of the material used for thin substrate 104. In another embodiment, the material used for carrier substrate 102 may be the same as that of thin substrate 104. In another embodiment, the thermal expansion coefficient of carrier substrate 102 and substrate 104 may not be equal or matched. Further, the wafer diameter of carrier substrate 102 may be substantially equal to or greater than the wafer diameter of thin substrate 104. Persons of skill in the semiconductor processing arts will appreciate that in certain embodiments of the present invention, carrier substrate 102 can be salvaged, and thus re-used, at the end of the semiconductor device fabrication cycle.

In various embodiments, carrier substrate 102 has a thickness that provides sufficient mechanical strength to the composite wafer structure. In other words, the sum of the combined thicknesses of carrier substrate 102 and thin substrate 104 should be sufficient to provide a mechanically stable structure during the FEOL and BEOL processing steps. In one example, carrier substrate 102 comprises silicon or sapphire having a thickness in a range of about 300 μm to 1200 μm thick, and thin substrate 104 comprises sapphire having a thickness in an approximate range of about 50 to 250 μm thick.

Bonding of carrier substrate 102 to thin substrate 104 (as illustrated by the arrows) may be performed using a variety of known wafer bonding techniques, including direct bonding, adhesive bonding, plasma activated bonding, anodic bonding, eutectic bonding, glass frit bonding, thermo-compression bonding and reactive bonding methods. By way of example, bonding may be achieved by mechanically pressing carrier substrate 102 to thin substrate 104. Alternatively, thin substrate 104 may be stacked on top of carrier substrate 102 such that bottom surface 105 and top surface 103 are in direct contact. The stack is then exposed to a high temperature anneal for such time sufficient to form a firm bond between carrier substrate 102 and thin substrate 104.

The bond may be achieved by means of Van-der-Waals forces (otherwise known as hydrogen bond), or by mutual penetration of the materials of the surface layers of the wafers to be bonded (eutectic bond). In this latter bonding method, the surfaces being bonded together should be extremely flat, which may be achieved, for example, by Chemical-Mechanical Polishing (CMP). The pressures and temperatures necessary to achieve a strong bond may vary with material of the wafers and are usually between 200 to 600 degrees Celsius. The result of bonding the carrier substrate 102 and thin substrate 104 may be referred to as a composite wafer (substrate).

Further shown in FIG. 1B, an interlayer 106 may be used to wafer bond carrier substrate 102 and thin substrate 104. Interlayer 106 affixes bottom surface 105 of thin substrate 104 to top surface 103 of carrier substrate 102. In one example, wherein carrier substrate 102 comprises silicon or sapphire and thin substrate 104 comprises sapphire, a thin layer (0.01 to 1 micrometer) of silicon dioxide can be deposited or thermally grown on either of carrier substrate 102, or thin substrate 104, or both, as a first step. Next, top surface 103 of carrier substrate 102 is brought into contact with bottom surface 105 of thin substrate 104. An anneal is then performed at about 900 to 1200° C. for several hours to bond the two substrates, thereby resulting in the formation of a single, composite wafer 107. In this example, interlayer 106 comprising silicon dioxide bonds bottom surface 105 to top surface 103.

It is appreciated that in other embodiments interlayer 106 may not be formed or needed depending on the particular wafer bonding technique (e.g., anodic bonding) utilized to attach the carrier substrate 102 to thin substrate 104.

Examples of other materials that may be used as interlayer 106 include epoxy (adhesive bonding), aluminum oxide, glass frit, solder, polymer or any other materials suitable for forming a secure bond between carrier substrate 102 and thin substrate 104.

As shown in FIG. 1B, composite wafer 107 comprises carrier substrate 102, interlayer material 106, and thin substrate 104. To prepare composite wafer 107 for subsequent semiconductor material epitaxial deposition, top surface 101 should be appropriately prepared. In other words, top surface 101 should be in a state of preparation such that it is ready for subsequent epitaxial processing steps used to form active regions of the fabricated semiconductor devices. For instance, top surface 101 may be subjected to mechanical and/or chemical polishing to produce an extremely flat (e.g., atomically-flat) surface suitable for epitaxial deposition. Alternatively, in other embodiments, top surface may be roughed, depending on the type of material types and processing steps utilized in the formation of the epitaxial layer.

FIG. 1C illustrates composite substrate 107 after completion of the FEOL and BEOL processing steps, resulting in the fabrication of semiconductor devices 108 disposed directly atop thin substrate 106. Semiconductor devices 108 typically comprise various epitaxial layers (e.g., heterostructures) which have undergone fabrication processes that may include planar and/or mesa structure formation, deposition/diffusion of impurities, etching, isolation, surface preparation, metallization, patterning, etc. In one embodiment, semiconductor devices 108 comprise nitride-based electronic and/or optoelectronic semiconductor devices. In a specific example, semiconductor devices 108 comprise gallium nitride (GaN) device structures.

In embodiments of the present invention, carrier substrate 102 is detached or de-bonded from thin substrate 104 subsequent to the formation of semiconductor devices 108, but prior to die separation, as shown in FIG. 1D. As discussed, de-bonding is the process of detaching the carrier substrate 102 from the thin substrate 104 regardless of the particular method used and/or the use of an interlayer. In the example shown in FIG. 1D, de-bonding results in the removal of interlayer 106. De-bonding may comprise techniques such as wet etch in a chemical solution that selectively removes interlayer material 106 while leaving carrier substrate 102, thin substrate 104 and semiconductor devices 108 intact. Laser lift-off may also be utilized to remove interlayer 106.

In still other embodiments, carrier substrate 102 may be destroyed by chemical, mechanical, or any other suitable methods which results in de-bonding of carrier substrate 102 from thin substrate 104, but still leaves thin substrate 104 and semiconductor devices 108 intact. In embodiments where carrier substrate 102 is not destroyed during de-bonding, it can be reused in another composite wafer structure (e.g., attached to another thin substrate).

When the carrier substrate 102 and the thin substrate 104 are bonded together without an interlayer, other separation techniques may be utilized. For example, mechanical separation by directed mechanical force application (the "knife blade" method) can be utilized, or local heat method (laser lift-off) can be applied.

Following de-bonding, the individual die comprising semiconductor devices 108 may be separated from one another. Die separation may be carried out by any one of a number of known techniques, e.g., laser scribing.

FIGS. 2A-2D illustrate cross-sectional side views of another example semiconductor wafer structure at various stages of the fabrication process. FIGS. 2A-2D illustrate a vertical device where the contact layer is additionally added onto the bottom surface of the substrate 204. FIG. 2A shows one example of a composite wafer 207 (which comprises a carrier substrate 202, an interlayer 206, and a thin substrate 204) and semiconductor devices 208 fabricated in the same manner as described in conjunction with FIG. 1C. FIG. 2B illustrates thin substrate 204 de-bonded from carrier substrate 202 in the same manner as described in conjunction with FIG. 1D. Similarly named and numbered elements shown in FIGS. 2A-2D couple and function as described above.

FIG. 2C is a cross-sectional side view showing the attachment or formation of a contact layer 210 to the bottom surface 205 of thin substrate 204 As illustrated, the top surface 209 of contact layer 210 is attached to bottom surface 205 of thin substrate 204 (as shown by the arrows). In one embodiment, contact layer 210 comprises a metal electrode that provides electrical connection to the semiconductor material of thin substrate 204. Contact layer 210 may be formed utilizing ordinary metal deposition techniques. FIG. 2D shows the resultant device structure following formation of contact layer 210 on the bottom surface 205 of thin substrate 204.

Figure 3A:
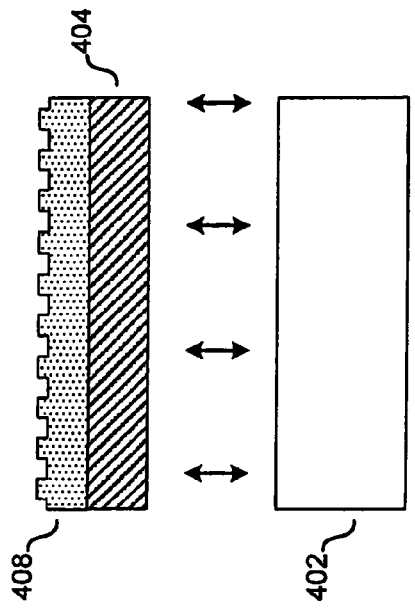
FIGS. 3A & 3B are cross-sectional side views which illustrate an example wafer structure at various stages of a die separation process, in accordance with embodiments of the present invention.
Figure 3B:
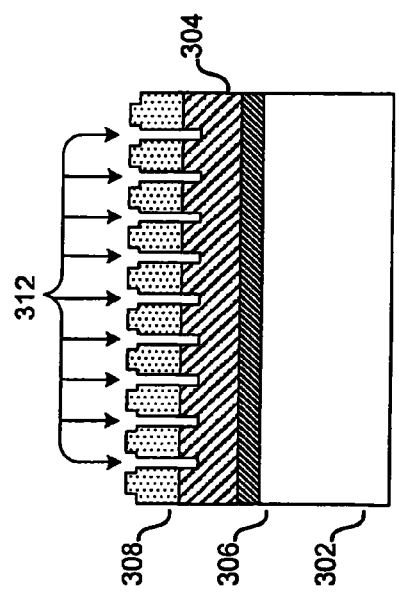

FIG. 3A is a cross-sectional side view of the example semiconductor wafer structure shown in FIG. 1C following the formation of grooves 312 as part of a die separation process. Similarly named and numbered elements shown in FIGS. 3A and 3B couple and function as described above. As shown, grooves 312 extend through the entire vertical thickness of the semiconductor devices 308, and into a portion of thin substrate 304, thereby individuating a plurality of semiconductor die 314. Each of the die 314 may comprise a separate semiconductor electronic or optoelectronic device. Grooves 312 may be formed in any one of a number of known methods, including dicing, laser scribing, cutting, etching, etc. FIG. 3B shows carrier substrate 302 separated from thin substrate 304 following the separation process discussed above. At this point, the thin substrate 304 may be broken in substantial vertical alignment with each of grooves 312 to completely separate the semiconductor die 314 from one another prior to packaging. In other embodiments a contact metal layer may be formed on the bottom surface of thin substrate 304 prior to the die separation process.

Figure 4B:
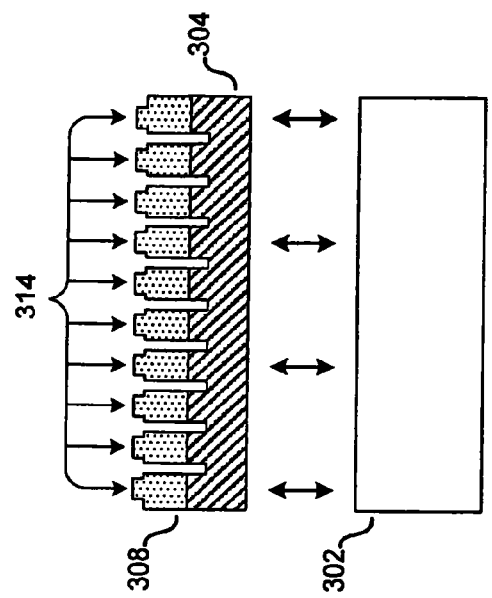

FIGS. 4A and 4B are cross-sectional side views of the example semiconductor wafer structure shown in FIG. 1D following the formation of grooves 412 as part of another die separation process. Similarly named and numbered elements shown in FIGS. 4A and 4B couple and function as described above. In this example, carrier substrate 402 is separated from thin substrate 404 prior to the formation of grooves 412, rather than afterwards (as shown in FIG. 3A). Any of the techniques discussed above may be used to form grooves 412 and separate the individual semiconductor die 414.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example thicknesses, material types, processing steps, etc., are provided for explanation purposes and that other values may also be employed in other embodiments and examples in accordance with the teachings of the present invention. These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

We claim:

1. A method comprising:
   (a) forming an interlayer that bonds a top surface of a carrier substrate to a bottom surface of a first substrate, the first substrate being of a first semiconductor material type and also having a top surface and a first thickness, the carrier substrate being of a second semiconductor material type and having a second thickness greater than the first thickness, the interlayer comprising silicon dioxide;
   (b) forming one or more nitride layers over the top surface of the first substrate;
   (c) fabricating nitride-based semiconductor devices in the one or more nitride layers; and
   (d) de-bonding the top surface of the carrier substrate from the bottom surface of the first substrate.

2. The method of claim 1 wherein in the first substrate comprises sapphire.

3. The method of claim 1 wherein the second thickness is approximately 400 µm thick or greater.

4. The method of claim 1 wherein the carrier substrate is selected from the group consisting of sapphire, silicon, silicon carbide, diamond, gallium nitride, aluminum nitride, boron nitride, and zinc oxide.

5. The method of claim 1 wherein the de-bonding step comprises performing a wet etch in a chemical solution.

6. The method of claim 1 wherein the nitride-based semiconductor devices are formed on individual dies of a wafer, and further comprising separating the individual dies prior to the de-bonding step.

7. The method of claim 1 wherein the nitride-based semiconductor devices are formed on individual dies of a wafer, and further comprising separating the individual dies after the de-bonding step.

8. The method of claim 1 further comprising polishing the top surface of the first substrate prior to forming the one or more nitride layers.

9. The method of claim 8 wherein the polishing of the top surface results in an atomically-flat top surface.

10. The method of claim 1 wherein the first and second semiconductor material types have respective first and second coefficients of thermal expansion that are substantially matched to one another.

11. The method of claim 1 wherein the first semiconductor material type is selected from a group consisting of sapphire, diamond, gallium nitride, aluminum nitride, boron nitride, silicon carbide, and zinc oxide.

12. The method of claim 1 wherein the second semiconductor material type is selected from a group consisting of silicon and sapphire.

13. The method of claim 1 wherein the nitride-based semiconductor devices are fabricated as a plurality of die, and further comprising:
   de-bonding the first substrate from the carrier substrate; and
   individuating each of the die.

14. The method of claim 1 wherein the nitride-based semiconductor devices are fabricated as a plurality of die, and wherein the de-bonding comprises:
   individuating each of the die; and
   for each of the individuated die, de-bonding the first substrate from the carrier substrate.

* * * * *